US008279577B2

(12) United States Patent  
Nguyen et al.

(10) Patent No.: US 8,279,577 B2  
(45) Date of Patent: Oct. 2, 2012

(54) SUBSTRATE SUPPORT HAVING FLUID CHANNEL

(75) Inventors: Andrew Nguyen, San Jose, CA (US); Wing Lau Cheng, Sunnyvale, CA (US); Hiroji Hanawa, Sunnyvale, CA (US); Semyon Kats, San Francisco, CA (US); Kartik Ramaswamy, San Jose, CA (US); Yan Ye, Saratoga, CA (US); Kwok Manus Wong, San Jose, CA (US); Daniel J. Hoffman, Saratoga, CA (US); Tetsuya Ishikawa, Saratoga, CA (US); Brian C. Lue, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/849,012

(22) Filed: Aug. 2, 2010

(65) Prior Publication Data  
US 2011/0024047 A1 Feb. 3, 2011

Related U.S. Application Data

(63) Continuation of application No. 10/989,975, filed on Nov. 16, 2004, which is a continuation of application No. 10/421,473, filed on Apr. 22, 2003, now Pat. No. 7,221,553.

(51) Int. Cl.  
*H01T 23/00* (2006.01)

(52) U.S. Cl. ........................................ 361/234; 361/230

(58) Field of Classification Search .................. 361/234, 361/230  
See application file for complete search history.

(56) References Cited

U.S. PATENT DOCUMENTS

| 4,628,991 A | 12/1986 | Hsiao et al. |
| 5,002,123 A | 3/1991 | Nelson et al. |
| 5,115,858 A | 5/1992 | Fitch et al. |
| 5,155,652 A | 10/1992 | Logan et al. |
| 5,186,238 A | 2/1993 | del Puerto et al. |
| 5,366,002 A | 11/1994 | Tepman |
| 5,423,945 A | 6/1995 | Marks et al. |
| 5,455,382 A | 10/1995 | Kojima et al. |
| 5,566,744 A | 10/1996 | Tepman |
| 5,676,205 A | 10/1997 | White |
| 5,725,718 A | 3/1998 | Banholzer et al. |
| 5,754,391 A | 5/1998 | Bates |
| 5,761,023 A | 6/1998 | Lue et al. |
| 5,838,528 A | 11/1998 | Os et al. |
| 5,883,778 A | 3/1999 | Sherstinsky et al. |

(Continued)

FOREIGN PATENT DOCUMENTS

WO WO 03/103004 12/2003

(Continued)

*Primary Examiner* — Danny Nguyen  
(74) *Attorney, Agent, or Firm* — Ashok K. Janah; Janah & Associates, P.C.

(57) ABSTRACT

A support for a substrate processing chamber comprises a chuck having a substrate receiving surface, and a base comprising an upper wall comprising a recessed trench having (i) an attachment face at a first depth, and (ii) a fluid channel at a second depth. A lower wall is seated in the recessed trench and attached to the attachment face of the upper wall, to close the fluid channel. A fluid inlet is provided to supply a heat transfer fluid to the fluid channel and a fluid outlet provided to discharge the heat transfer fluid from the fluid channel.

32 Claims, 7 Drawing Sheets

U.S. PATENT DOCUMENTS

| | | |
|---|---|---|
| 5,886,866 A | 3/1999 | Hausmann |
| 5,892,207 A | 4/1999 | Kawamura et al. |
| 5,968,276 A | 10/1999 | Lei et al. |
| 6,015,761 A | 1/2000 | Merry et al. |
| 6,079,356 A | 6/2000 | Umotoy et al. |
| 6,107,608 A | 8/2000 | Hayes |
| 6,180,926 B1 | 1/2001 | Duddy et al. |
| 6,278,089 B1 | 8/2001 | Young et al. |
| 6,310,755 B1 | 10/2001 | Kholodenko et al. |
| 6,320,736 B1 | 11/2001 | Shamouilian et al. |
| 6,357,143 B2 | 3/2002 | Morad et al. |
| 6,423,976 B1 | 7/2002 | Glavish et al. |
| 6,434,003 B1 | 8/2002 | Roy et al. |
| 6,440,221 B2 | 8/2002 | Shamouilian et al. |
| 6,466,426 B1 | 10/2002 | Mok et al. |
| 6,489,248 B2 | 12/2002 | Zhang et al. |
| 6,499,533 B2 | 12/2002 | Yamada |
| 6,518,548 B2 | 2/2003 | Sugaya et al. |
| 6,563,686 B2 | 5/2003 | Tsai et al. |
| 6,677,167 B2 | 1/2004 | Kanno et al. |
| 6,689,930 B1 | 2/2004 | Pang et al. |
| 6,786,982 B2 | 9/2004 | Lee et al. |
| 6,824,455 B2 | 11/2004 | Osterheld et al. |
| 6,827,815 B2 | 12/2004 | Hytros et al. |
| 6,853,067 B1 | 2/2005 | Cohn et al. |
| 6,902,934 B1 | 6/2005 | Bergh et al. |
| 7,044,212 B1 | 5/2006 | Hofmann |
| 7,221,553 B2 | 5/2007 | Nguyen et al. |
| 7,223,308 B2 | 5/2007 | Pancham et al. |
| 7,244,311 B2 | 7/2007 | Fischer |
| 7,311,779 B2 | 12/2007 | Nguyen et al. |
| 7,402,210 B2 | 7/2008 | Chen et al. |
| 7,429,718 B2 | 9/2008 | Inagawa et al. |
| 7,494,628 B2 | 2/2009 | Pokharna et al. |
| 7,560,081 B2 | 7/2009 | Takai et al. |
| 7,591,907 B2 | 9/2009 | Chen et al. |
| 7,741,585 B2 | 6/2010 | Quach et al. |
| 7,766,075 B2 | 8/2010 | Vetrovec et al. |
| 7,768,765 B2 | 8/2010 | Nguyen et al. |
| 2002/0072164 A1 | 6/2002 | Umotoy et al. |
| 2003/0017087 A1 | 1/2003 | Pokharna et al. |
| 2003/0101938 A1 | 6/2003 | Ronsse et al. |
| 2003/0159307 A1* | 8/2003 | Sago et al. ............ 34/107 |
| 2003/0228772 A1 | 12/2003 | Cowans |
| 2004/0115947 A1 | 6/2004 | Fink et al. |
| 2004/0149716 A1 | 8/2004 | Inagawa et al. |
| 2007/0006936 A1 | 1/2007 | Hosokawa et al. |
| 2007/0258186 A1 | 11/2007 | Matyushkin et al. |
| 2008/0295872 A1 | 12/2008 | Riker et al. |
| 2009/0159566 A1 | 6/2009 | Brillhart et al. |
| 2009/0294101 A1 | 12/2009 | Fovell et al. |

FOREIGN PATENT DOCUMENTS

| | | |
|---|---|---|
| WO | WO 2004/034444 | 4/2004 |

* cited by examiner

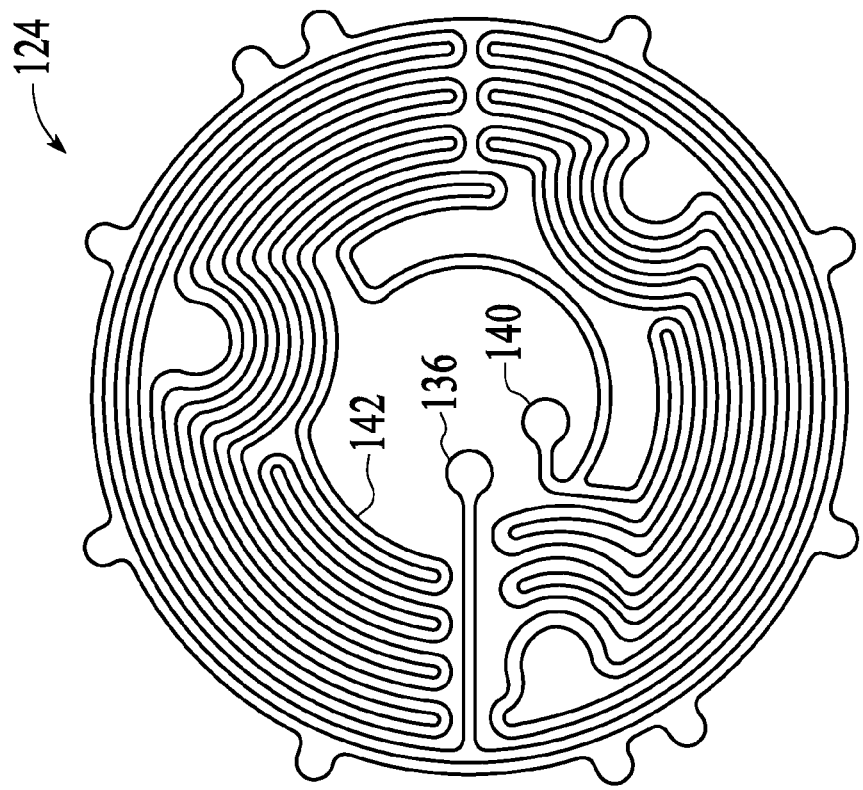
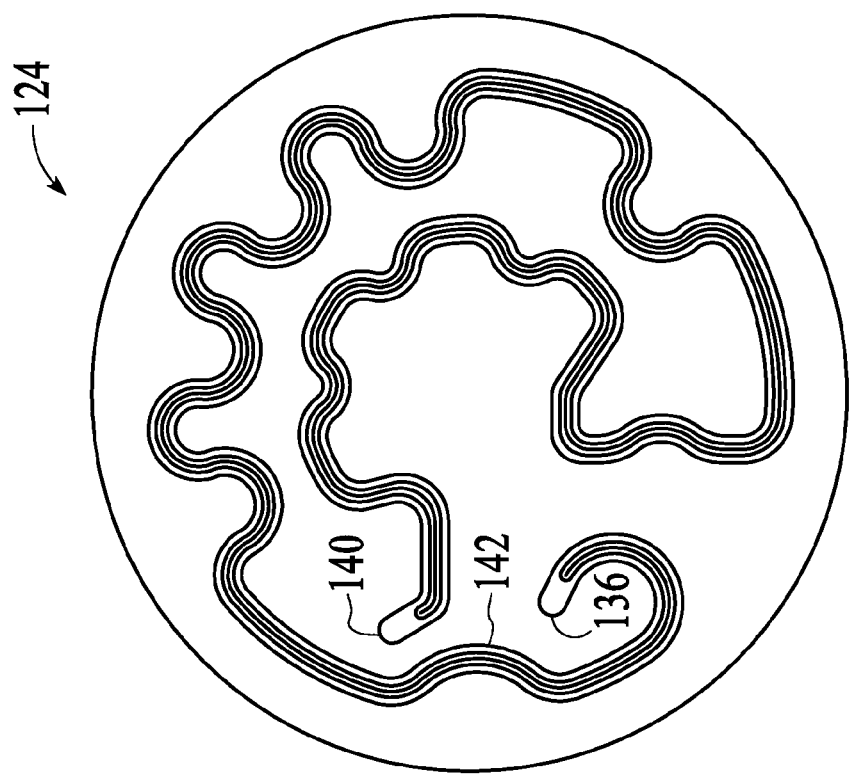

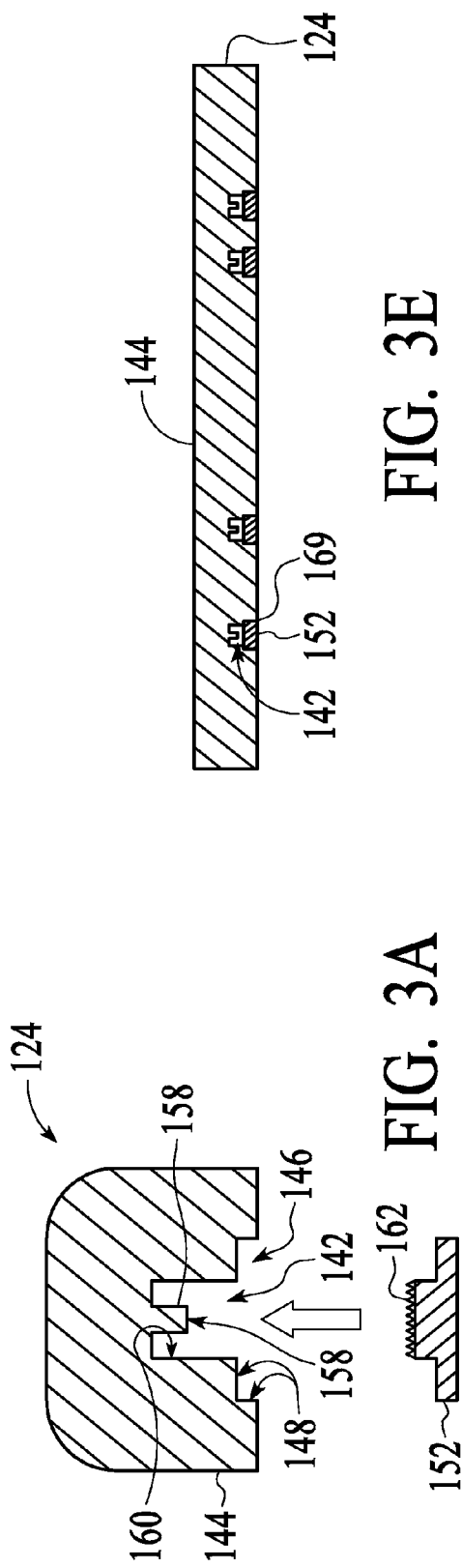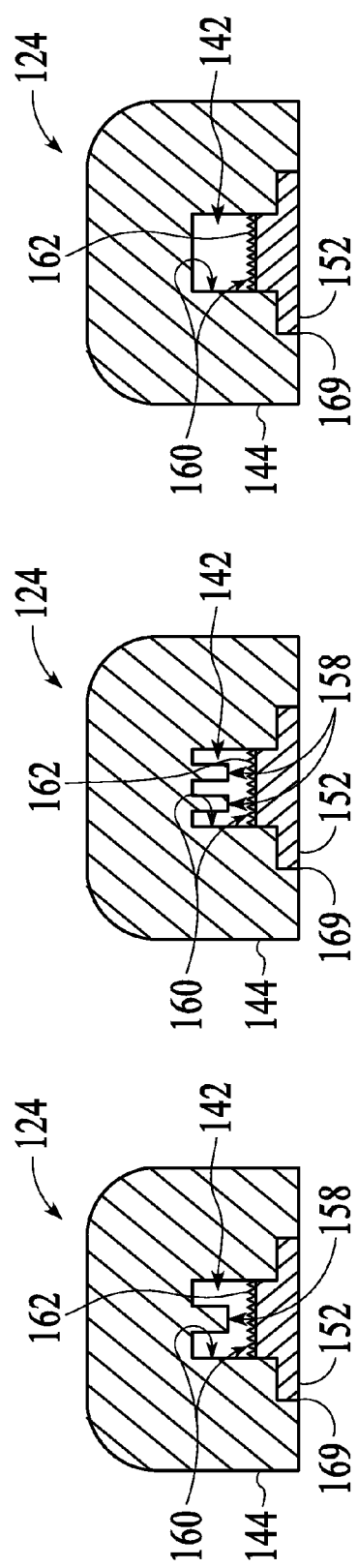

US 8,279,577 B2

SUBSTRATE SUPPORT HAVING FLUID CHANNEL

RELATED APPLICATION

This application is filed as a continuation of and claims priority from U.S. patent application Ser. No. 10/989,975 filed on Nov. 16, 2004, which is a continuation of U.S. patent application Ser. No. 10/421,473, filed on Apr. 22, 2003, now issued as U.S. Pat. No. 7,221,553, both of which are incorporated by reference herein and in their entireties.

BACKGROUND

Embodiments of the present invention relate to a support for holding a substrate during processing.

A substrate support is used to hold a substrate, such as a silicon wafer or display, in a process chamber. The support can comprise a pedestal that receives a chuck that is capable of holding the substrate. The chuck may be a mechanical, vacuum, or electrostatic chuck. The electrostatic chuck electrostatically holds the substrate by electrostatically charging a monopolar or bipolar electrode covered by, or embedded in, a dielectric material, such as ceramic or polymer. The pedestal allows the electrical connections to the chuck to pass through and may also have fluid circulating conduits and channels to circulate a heat transfer fluid to heat or cool the substrate being held on the chuck during processing.

Newly developed plasma processes for the fabrication of integrated circuits are often performed at low, often sub-zero, temperatures or at high temperatures, which may exceed 100° C. For example, certain etching processes, such as processes used to etch low K dielectric materials, may be performed at temperatures below zero, for example, at −20 to −40° C. Conversely, processes for etching copper or platinum, or sputtering (PVD) processes, are often conducted at high temperatures of from 250 to 600° C., and temperatures used to etch aluminum may range from 100 to 200° C. It is difficult to maintain uniform temperatures across the surface of a substrate during such processes, especially when the plasma contributes to the heat load. For example, a gas plasma that is sustained by applying a power level of 2000 Watts to an inductor antenna or electrode can generate temperature variations of at least about 10° C. across a 300 mm diameter wafer. These temperature variations can have different magnitudes across the surface of the substrate.

In one method of maintaining more uniform temperatures across the substrate, heat transfer channels are distributed in the pedestal or chuck, and a cooled or heated fluid is circulated in the channels to stabilize substrate temperatures. The channels originate at a fluid inlet that receives the cooled or heated fluid, traverse the area of the support in a circuitous pathway, and terminate at a fluid outlet. However, the temperature of the support at the fluid inlet can often be hotter or colder than the temperature of the support at the fluid outlet, depending on whether the fluid receives or dissipates heat in traveling from the inlet to the outlet. In another configuration, the fluid channel loops back upon itself to form two closely abutting pathways that traverse across the area of the support. While the looped back channel reduces the inlet to outlet temperature variation, a hot or cold spot often still forms at the region of the support where the channel loops back upon itself.

Thus, it is desirable to have an apparatus capable of supporting and maintaining a substrate at uniform temperatures, especially when the substrate is processed at sub-zero or hot temperatures. It is also desirable to control the temperature of the substrate in processes that generate different heat loads, especially plasma processes.

SUMMARY

A support for a substrate processing chamber comprises a chuck having a substrate receiving surface, and a base comprising an upper wall comprising a recessed trench having (i) an attachment face at a first depth, and (ii) a fluid channel at a second depth. A lower wall is seated in the recessed trench and attached to the attachment face of the upper wall, to close the fluid channel. A fluid inlet is provided to supply a heat transfer fluid to the fluid channel and a fluid outlet provided to discharge the heat transfer fluid from the fluid channel.

A substrate support comprising an electrostatic chuck having a substrate receiving surface; and (b) a base comprising (1) an upper wall comprising a recessed trench having (i) an attachment face at a first depth, and (ii) a fluid channel at a second depth, the fluid channel comprising at least one fin therein; (2) a lower wall seated in the recessed trench and attached to the attachment face of the upper wall, to close the fluid channel; (3) a fluid inlet to supply a heat transfer fluid to the fluid channel; and (4) a fluid outlet to discharge the heat transfer fluid from the fluid channel.

A substrate support comprising an electrostatic chuck having a substrate receiving surface and a base comprising (1) an upper wall comprising a recessed trench having (i) an attachment face at a first depth, and (ii) a fluid channel at a second depth, the fluid channel comprising at least one fin therein; (2) a lower wall seated in the recessed trench and attached to the attachment face of the upper wall, to close the fluid channel; (3) a fluid inlet and a fluid outlet that are near each other.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIGS. 2a to 2b are schematic top views of embodiments of a substrate support having serpentine fluid channels;

FIG. 3a is an exploded cross-sectional side view of a portion of an assembly of shaped walls used to form the substrate support of FIG. 1;

FIG. 3b is an exploded cross-sectional side view of the portion of the substrate support of FIG. 3a after assembly;

FIG. 3c is an exploded cross-sectional side view of a portion of an embodiment of a substrate support having a channel with two integral fins extending therein;

FIG. 3d is an exploded cross-sectional side view of a portion of an embodiment of a substrate support having a channel with no integral fins extending therein;

FIG. 3e is a cross-sectional side view of an embodiment of a substrate support having the channel of FIG. 3b passing therethrough;

FIG. 4b is a cross-sectional side view of the substrate support of FIG. 4a;

DESCRIPTION

Figure 1:
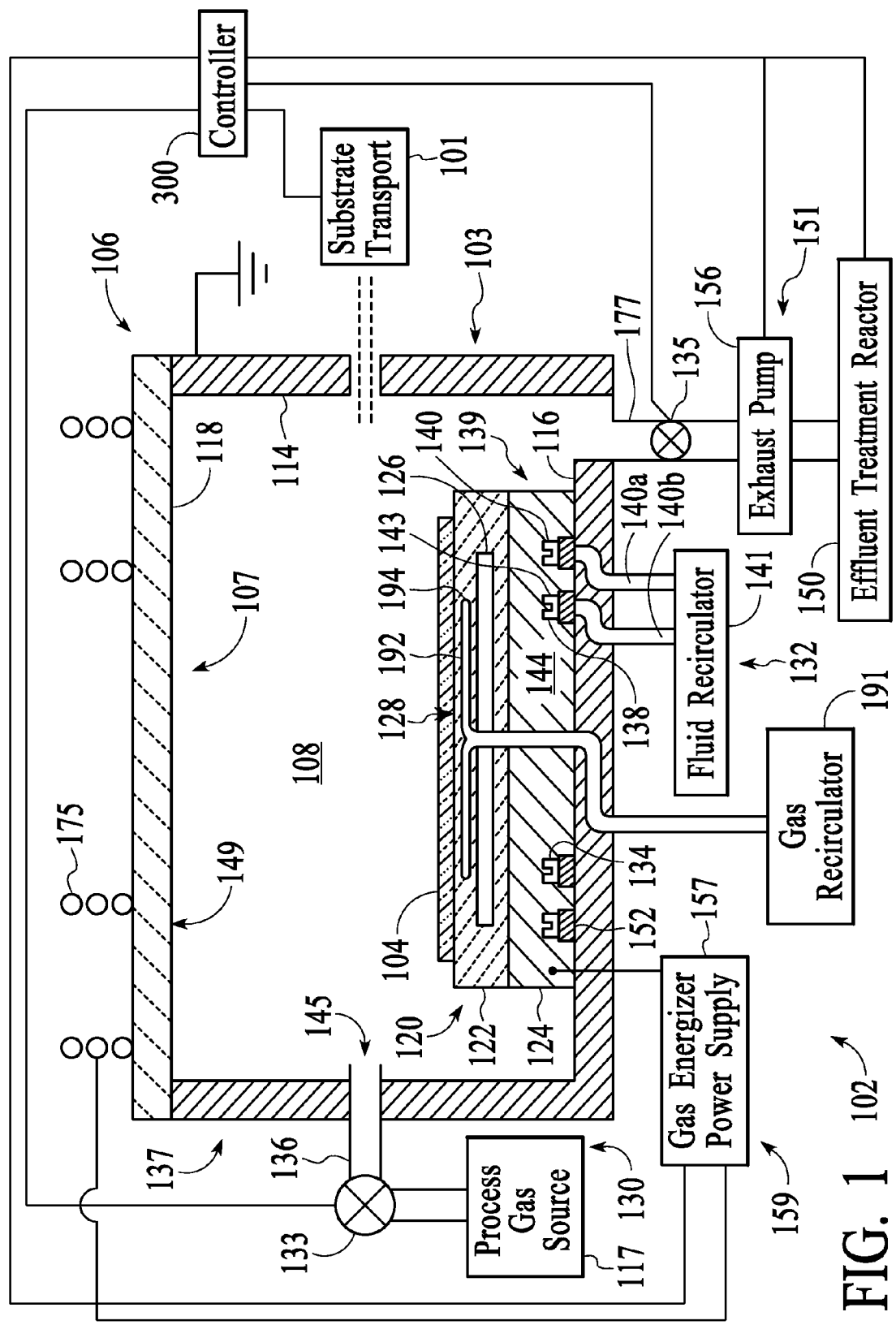
FIG. 1 is a schematic side view of an embodiment of a substrate processing apparatus and process chamber.

A substrate processing apparatus 102 comprises a process chamber 106 having a process zone 108 for processing of the substrate 104. The process chamber 106 may be a chamber 106 adapted to etch or deposit material on the substrate 104. For example, the process chamber 106 may be an etching chamber type such as a DPS®, Etch Centura®, MERIE HART Centura®, MXP®, Super e Centura®, IPS Centura® (all trademarks of Applied Materials, Santa Clara, Calif., and all of which are fabricated by the same), eMax chamber, or a chemical vapor deposition (CVD) or physical vapor deposition (PVD) chamber. An exemplary embodiment of an apparatus 102 suitable for processing a substrate 104 is shown in FIG. 1. The process chamber 106 is suitable for processing substrates 104, such as semiconductor wafers, and may be adapted by those of ordinary skill to process other substrates 104, such as flat panel displays, polymer panels, or other electrical circuit receiving structures. The chamber 106 is particularly useful for processing layers, such as etch resistant, silicon-containing, metal-containing, dielectric, and/or conductor layers on the substrate 104. Generally, the process chamber 106 comprises a wall 107, such as an enclosure wall 103, which may comprise a ceiling 118, sidewalls 114, and a bottom wall 116, that encloses the process zone 108. The chamber 106 may be fabricated from any of a variety of materials including metals, semiconductors, ceramics, glasses, polymers and composite materials. Metals commonly used to fabricate the chamber 106 include aluminum, anodized aluminum, "HAYNES 242," "Al-6061," "SS 304," "SS 316," and INCONEL, of which anodized aluminum is used to fabricated a preferred version. The ceiling 118 comprises a flat, rectangular, arcuate, conical, dome, or multiradius-arcuate shape. The particular embodiment of the apparatus 102 shown herein is suitable for processing of active and passive electronic devices on a substrate 104, and is provided only to illustrate the invention, and should not be used to limit the scope of the invention.

The process chamber 106 further comprises a substrate support 120 to support the substrate 104 in the chamber 106. The substrate support 120 comprises a chuck 122 having a substrate receiving surface 128. The chuck 122 may be a vacuum, mechanical or electrostatic chuck. A vacuum chuck has vacuum ports from which to apply a negative gas pressure to hold the substrate 104. A mechanical chuck comprises clamps (not shown) at the edge of the chuck to hold the substrate 104. A suitable electrostatic chuck 122a comprises a dielectric 125 having an embedded electrode 126 that may be charged to generate an electrostatic force capable of electrostatically holding a substrate 104 to the receiving surface 128 of the chuck 122. For example, the dielectric 125 of the electrostatic chuck 122a may comprise AlN. A voltage may be applied to the electrode 126 via an electrical contact that extends through the dielectric 125. The electrode 126 may comprise a semiconductor or metal material. The base 124 typically comprises a metal, such as for example aluminum.

The substrate support 120 comprises a heat transfer system 132 to maintain the substrate support 120 at a desired temperature. For example, the heat transfer system 132 is adapted to maintain the substrate receiving surface 128 of the support 120 at a desired temperature to regulate the temperature of the substrate 104 sitting thereon. The heat transfer system 132 allows control of the temperature of the substrate 104 by compensating for variations in the calorific heat or heat conductance across the body of the support 120, which are a particular problem for supports 120 made from different materials or having complex internal configurations. Also, different processes may generate different plasma heat loads. In one embodiment, the heat transfer system 132 is adapted to maintain the substrate 104 at a temperature of from about −10 to about −30° C., such as about −20° C.

The heat transfer system 132 of the substrate support 120 comprises a fluid circulating reservoir 134 below the chuck 122, a fluid inlet 143 for supplying a fluid 138 into the reservoir 134, and a fluid outlet 140 for discharging the fluid 138 from the reservoir 134. The fluid 138 is preferably a liquid because it can have a higher specific heat and allow more turbulence than a gas. More preferably, the fluid 138 is a heat transfer fluid having high thermal conductivity and/or higher specific heat. The heat transfer fluid 138 is a liquid or gas medium that is suitable for exchanging heat, or thermal energy.

A fluid recirculator 141 may be provided to pass the fluid 138 through the reservoir 134 at a preselected temperature. For example, the fluid recirculator 141 may comprise a pump (not shown) to pump the fluid 138 through the reservoir 134, a cooler or heater (also not shown) to cool or heat the heat transfer fluid 138, and a thermostat (also not shown) to monitor the temperature of the heat transfer fluid 138 and control the cooler or heater to maintain the temperature at a desired level. In operation, the heat transfer fluid 138 is supplied to the fluid inlet 143 of the fluid conduit reservoir 134. The fluid 138 pumped into the fluid inlet 143, flows through the reservoir 134 to heat or cool the body of the chuck 122 (depending on the relative temperatures of the fluid 138 and the chuck 122), and is removed or exhausted from the fluid outlet 140. The reservoir 134 may be in the base 124 below the chuck 122 to provide more control over the temperature of the chuck 122, particularly when the chuck 122 is made of a ceramic material, such as aluminum nitride, aluminum oxide, or silicon oxide.

In one version, the heat transfer system 132 comprises a reservoir 134 that is an elongated fluid channel 142, embodiments of which are illustrated in FIGS. 2a and 2b. As illustrated in FIG. 3a, the heat transfer system 132 comprises an upper wall 144 having a recessed trench 146 with an attachment face 148 at a first depth. The fluid channel 142 is further sunken into the recessed trench 146 at a second depth, such that the fluid channel 142 at the second depth has a smaller width than the recessed trench 146 at the first depth. The fluid channel 142 may have an aspect ratio of depth to width of from about 2:1 to about 4:1 to provide a desirable fluid flux and inner surface area. A lower wall 152 is seated into the recessed trench 146 of the upper wall 144, and attached at the attachment face 148, to close the fluid channel 142, forming a fluid-tight enclosure about the fluid channel 142. A cross-sectional view of the assembled base 124 about the fluid channel 142 is illustrated in FIG. 3b, and a cross-sectional view of the entire assembled base 124 is illustrated in FIG. 3e. The large, substantially continuously uninterrupted volume of the reservoir 134 across the support 120 provides better and more uniform heat transfer rates across the substrate 104. This improves the ability of the support 120 to tolerate rapid or more severe changes in substrate temperature due to different heat loads from other process variations.

The upper wall 144 can be manufactured using machine tools and computer aided automation equipment to form the recessed trench 146 and the fluid channel 142. The upper wall 144 may be electron beam brazed or welded to the lower wall 152 at the attachment face 148. For example, the upper and lower walls 144, 152 may be bonded at a bonding region 169 along the radial periphery 154 of the attachment face 148, as shown in FIG. 3b.

In one version, the elongated fluid channel 142 comprises serpentine convolutions such that the fluid channel 142 curves back and forth along its length, embodiments of which are illustrated in FIGS. 2a and 2b. Generally, a boundary layer of fluid 138 adjacent to the inner surfaces 160 of the channel 142 is substantially static relative to the movement of the non-boundary fluid layers farther away from the channel inner surfaces 160. When the boundary layer molecules absorb the heat and raise in temperature, they can no longer absorb further heat. As a result, the transference of heat from the inner surfaces 160 into the fluid 138 is limited and constrained. In contrast, the flow of the channel 142 has a serpentine pattern that repetitively cascades along the length of the fluid channel 142 to introduce perturbations into the heat transfer fluid 138, resulting in the breakage of temperature boundary layers of the fluid 138 flowing through the channel 142. The serpentine pattern perturbs laminar flow of the heat transfer fluid 138 through the channel 142 to expose high temperature contour lines within the fluid 138 to the inner surfaces 160 of the upper and lower walls 144, 152 and thereby increase heat conduction to or from the upper and lower walls 144, 152. The contour lines are imaginary lines perpendicular to the gradient vector field corresponding to the temperature scalar field. As the heat transfer fluid 138 flows through the serpentine fluid channel 142, the contour lines are perturbed to become less parallel to the inner surfaces 160 of the upper and lower walls 144, 152. The serpentine fluid channel 142 is shaped to have a sufficient density of back-and-forth turns along its length to substantially perturb the heat transfer fluid 138. In one embodiment, the upper and lower walls 144, 152 are adapted to form the serpentine fluid channel 142 to have at least about 1 back-and-forth turn per 5 centimeters. The back-and-forth turns are typically formed as a counter-flow to have more effective heat transfer characteristics.

In one embodiment, the upper wall 144 comprises one or more integral fins 158 extending outwardly into the elongated fluid channel 142 to enhance heat transfer, as illustrated in FIGS. 3b and 3c. The integral fins 158 form a unitary member with the upper wall 144 and extend outwardly from the upper wall 144 a length sufficiently long to form a gap between the tips of the fins 158 and the lower wall 152. For example, the upper wall 144 may comprise one to three fins 158. An exemplary embodiment wherein the upper wall 144 comprises one fin 158 is illustrated in FIG. 3b, an embodiment wherein the upper wall 144 comprises two fins 158 is illustrated in FIG. 3c, and an embodiment wherein the upper wall 144 does not comprise any fins 158 is illustrated in FIG. 3d. The integral fins 158 may have an aspect ratio of height to thickness of at least about 10:1 to enhance heat transfer between the heat transfer fluid 138 and the substrate support 120. Typically, the integral fins 158 are a unitary member with the upper wall 144, formed from the same material and substantially without any bonding lines therebetween, to provide good structural integrity and unimpeded heat conduction.

The elongated fluid channel 142 may have a first cross-section along a first length of the channel 142 and a second cross-section along a second length of the channel 142. For example, the channel 142 may have an alternating cross-section that changes back and forth along its length. The alternating cross-section creates turbulence in the heat transfer fluid 138 and thereby enhances heat transfer between the fluid 138 and the chuck 122. As the heat transfer fluid 138 passes through the channel 142, the laminar flow of the fluid 138 is perturbed to prevent the stagnation of fluid laminae near the inner surface of the channel 142. One example is a channel 142 where the cross-section alternates between one or more of (a) one integral fins 158 (as shown in FIG. 3b) (b) two integral fins 158 (FIG. 3c), and (c) no integral fins 158 (FIG. 3d), extending into the channel 142. The change in cross-section may occur abruptly or gradually along the length of the channel 142. The change in cross-section causes perturbation and turbulence in the flow of the heat transfer fluid 138 to redistribute the temperature field of the heat transfer fluid 138, thereby enhancing heat transfer between the fluid 138 and the substrate support 120.

In another embodiment, the elongated fluid channel 142 comprises a roughened internal surface 160 having a root mean square (rms) surface roughness value of at least about 125 microns, as shown in FIGS. 3a through 3d. For example, the rms surface roughness value of the internal surface 160 may be from about 125 to about 1000 microns such that the internal surface 160 is not so rough that it excessively impedes the flow of the heat transfer fluid 138. The surface roughness value is the square root of the mean of the squared values of the vertical deviation of the real surface from an ideal form. The roughened internal surfaces 160 of the upper and lower walls 144, 152 create turbulence in the heat transfer fluid 138 to enhance the transfer of heat to or from the fluid 138. As the heat transfer fluid 138 flows across the roughened internal surface 160, the flow of the fluid 138 is disrupted to cause particles in the fluid to be deflected in random directions while still maintaining an overall flow direction continuing along the length of the fluid channel 142. The disruption of the fluid particles rearranges the spatial temperature distribution of the fluid particles in the channel 142, causing some higher temperature particles to move closer to the inner surfaces 160 of the channel 142. Outer laminae of the heat transfer fluid 138 are in close proximity to the inner surfaces 160 of the elongated fluid channel 142 and therefore approach the temperature of the support 120. These outer laminae come upon the obstructive protrusions 162 and are redirected inwardly to redistribute the temperatures in the heat transfer fluid 138. This spatial temperature re-distribution enhances heat conduction between the heat transfer fluid 138 and the support 120.

In one embodiment, the elongated fluid channel 142 is doubled over upon itself to reduce the temperature gradient along the channel 142, as shown in FIG. 2a. For example, substantially the entire length of the elongated fluid channel 142 may be near another portion of the channel 142 to balance the temperature throughout the channel 142. Doubling over the channel 142 equalizes the temperature along the length of the channel 142 by placing portions of the channel 142 that correspond in hot/cold temperatures as neighbors such that the temperatures at these portions sum and substantially equalize.

For example, for a heat transfer fluid 138 that is hot, the temperature of the fluid 138 in the channel 142 is highest where the fluid 138 enters through the fluid inlet 143. The temperature of the fluid 138 generally decreases continuously as the fluid 138 passes through the length of the channel 142, and is lowest as it exits through the outlet 140. By arranging the channel 142 such that the inlet 136 and outlet 140 portions are near each other, for example as shown in FIGS. 2a and 2b, the two portions next to the inlet 136 and outlet 140 moving toward the center of the channel 142, respectively, are near each other, and so on, the temperatures at these corresponding portions are matched to substantially flatten what would otherwise be a temperature gradient along the length of the channel 142.

Figure 4A:
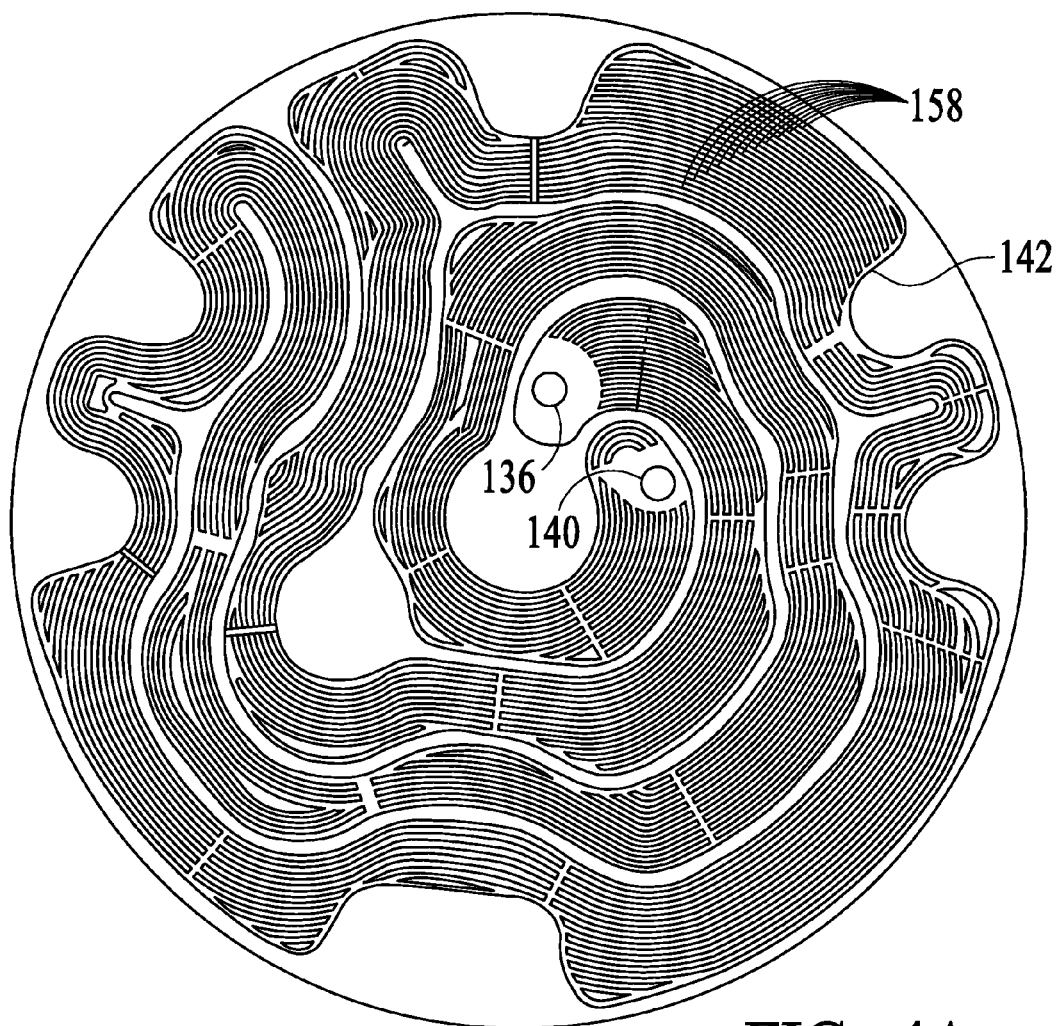
FIG. 4a is a schematic top view of an embodiment of a substrate support having serpentine fluid channels.
Figure 4B:
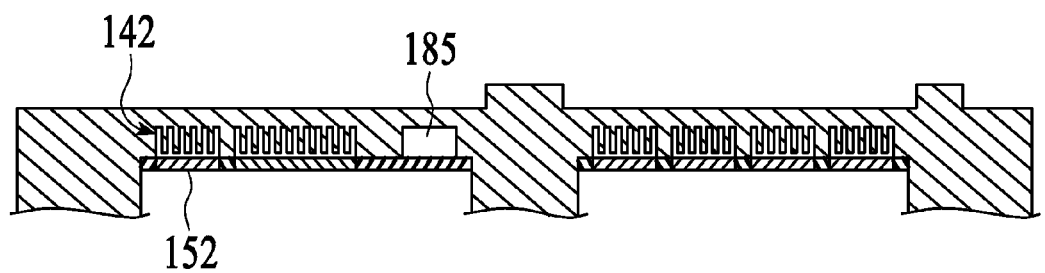

Another exemplary embodiment of an elongated fluid channel 142 is illustrated in FIG. 4a in a schematic top view that shows the multiple integral fins 158 in the channel 142, and in FIG. 4b from a cross-sectional sideways perspective. This embodiment of the channel 142 comprises more integral fins 158 than the embodiments shown in FIGS. 3a-e, and the number of integral fins 158 changes along the length of the channel 142. As the channel 142 becomes wider, the number of integral fins 158 generally increases, and as the channel 142 narrows, the number of integral fins 158 generally decreases. As the heat transfer fluid 138 passes through the channel 142, the heat transfer fluid 138 is variably perturbed as it is forced to laterally spread and contract, and fit between the changing numbers of integral fins 158. For example, FIG. 4b shows six cross-sections of the channel 142. From left to right, the cross-sections comprise integral fins 158 numbering 6, 11, 6, 6, 6, and 6, respectively, corresponding to different sections of the channel 142 having different widths.

Figure 5:
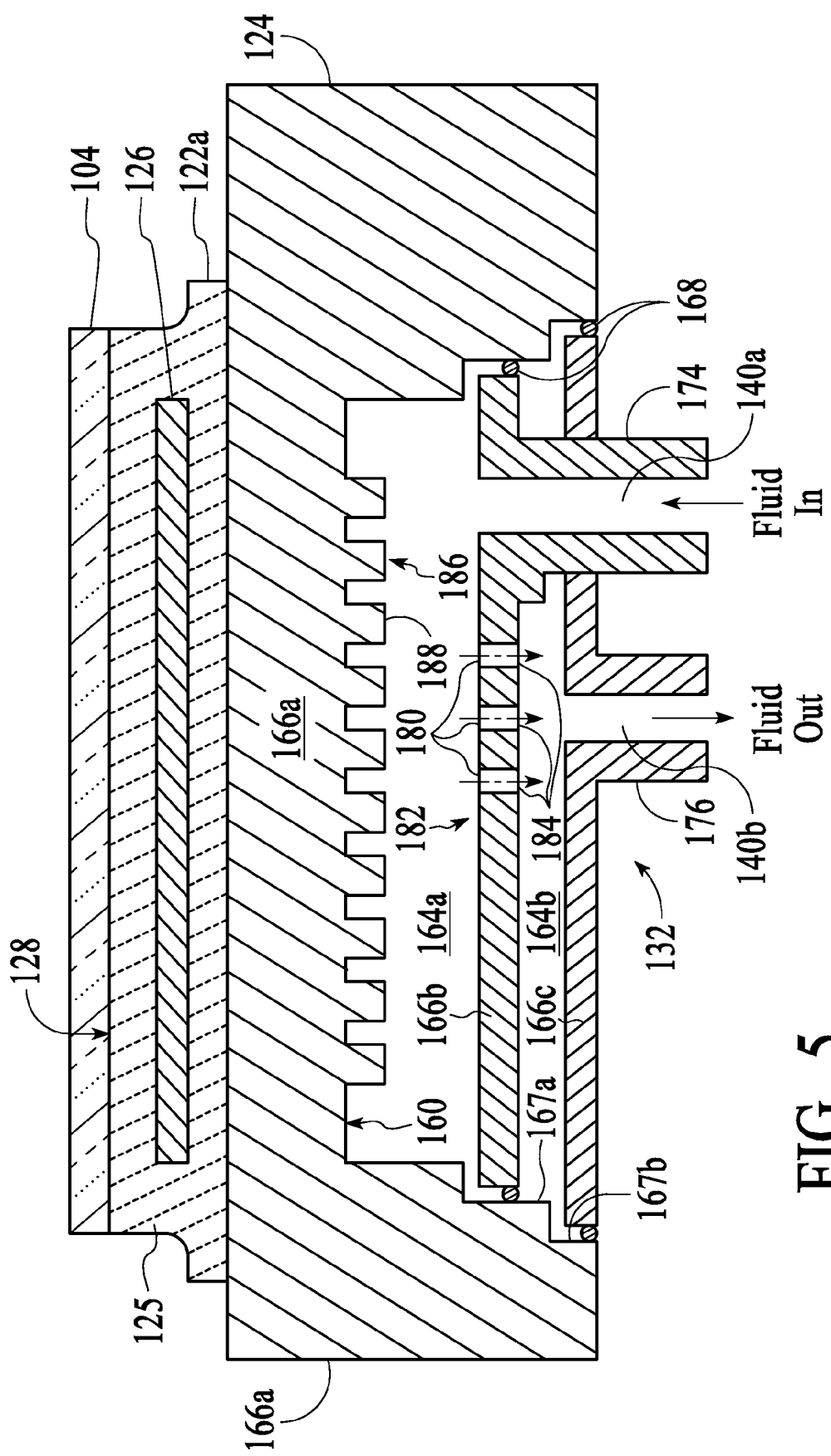
FIG. 5 is a cross-sectional side view of an embodiment of a substrate support comprising an electrostatic chuck and a fluid reservoir below the chuck.
Figure 6:
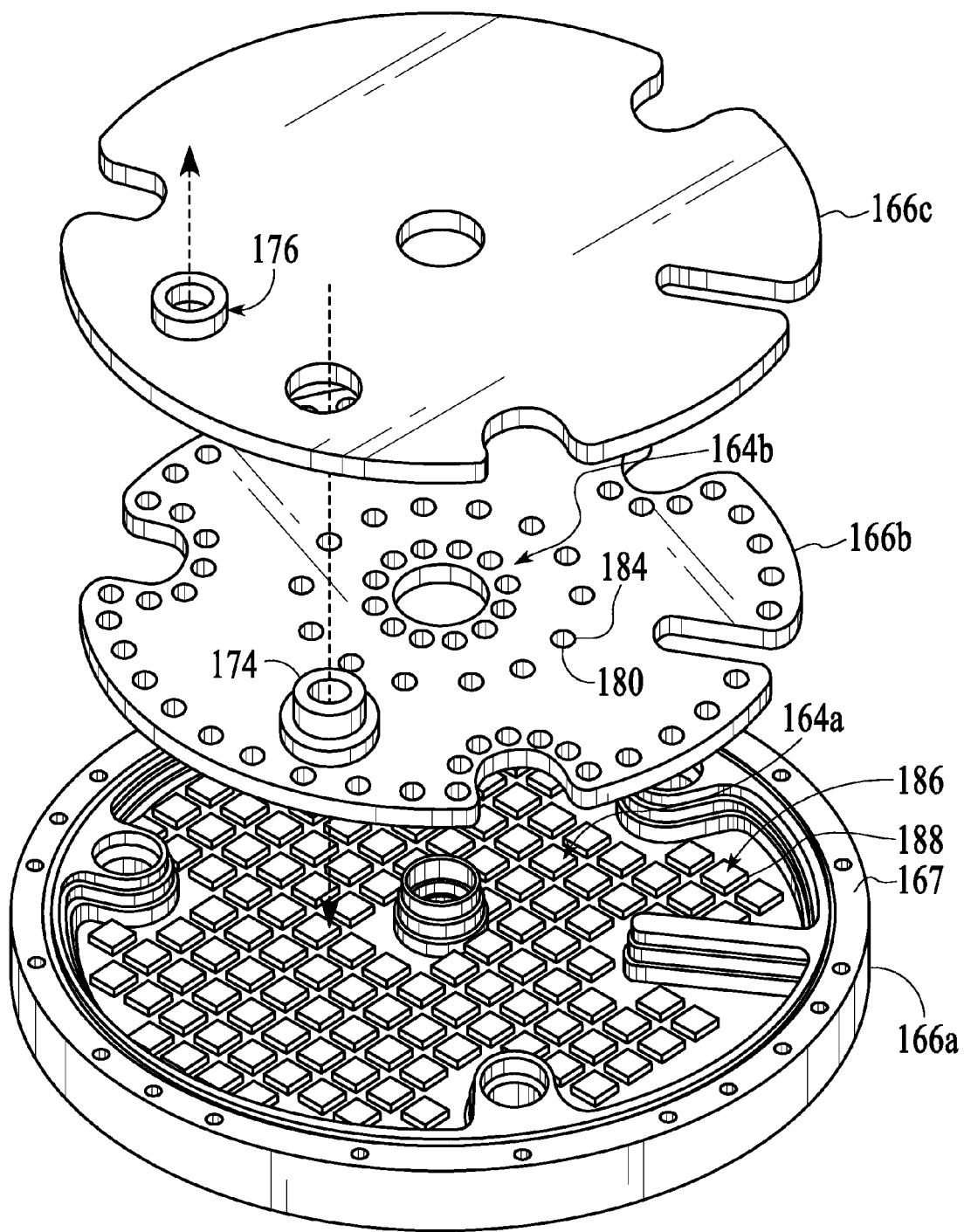
FIG. 6 is a perspective view of an assembly of shaped walls used to form the substrate support of FIG. 5.
Figure 7:
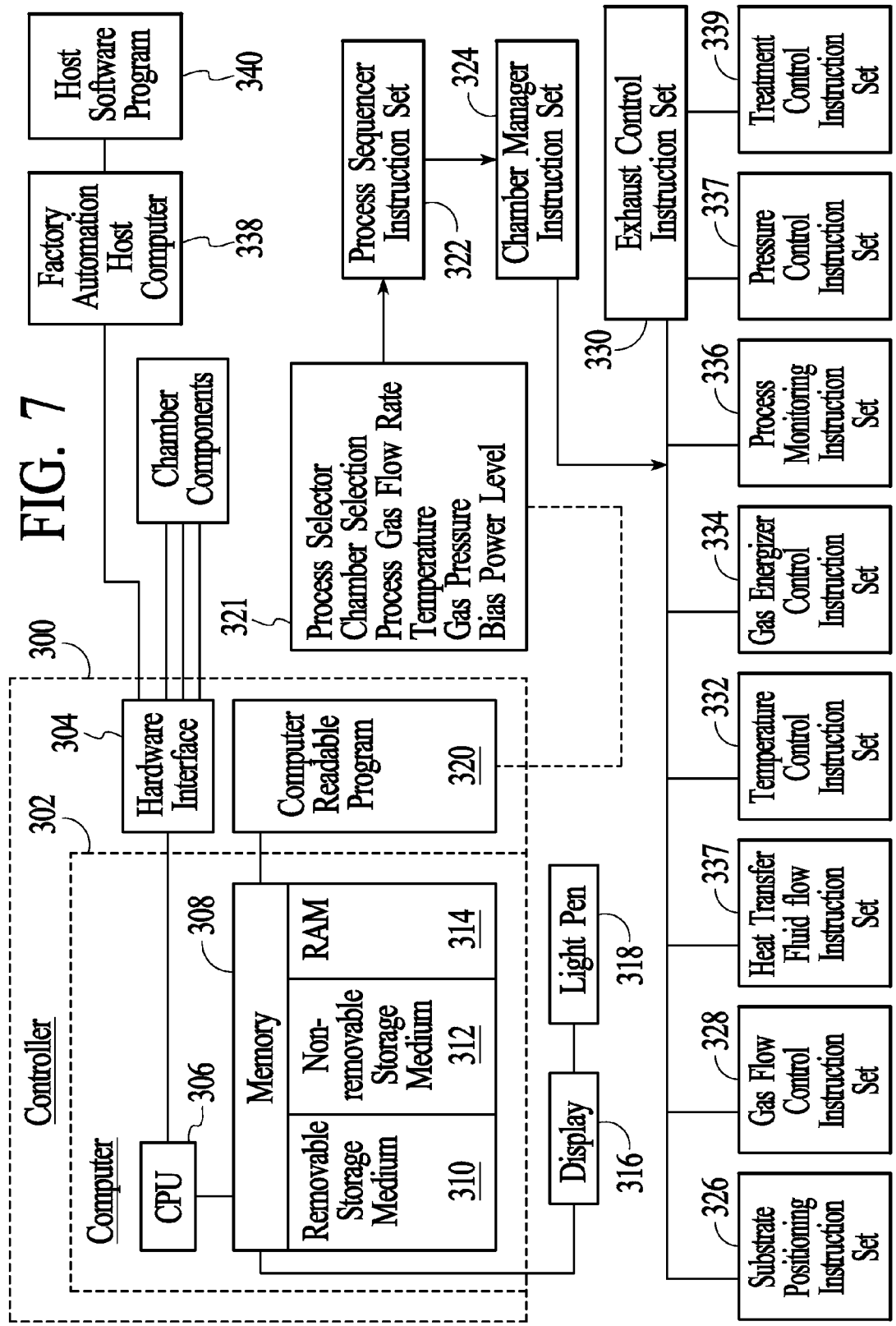
FIG. 7 is a flow chart of the controller which may be used to operate the substrate processing apparatus and process chamber.

In an alternative version of the fluid circulating reservoir 134, an exemplary embodiment of which is illustrated in FIG. 5, the reservoir 134 comprises an upper wall 166a and a lower wall 166b with an enclosed volume therebetween. A peripheral sidewall 167 joins the upper wall 166a to the lower wall 166b. The peripheral sidewall 167 of the reservoir 134 is about a perimeter of the substrate 104. The reservoir 134 of the heat transfer system 132 may be a closed basin 164 having a shallow, round shape that is adapted to contain a volume of the heat transfer fluid 138. The substrate receiving surface 128 covers an area, and the reservoir 134 extends across at least about 60% of the area of the substrate receiving surface 128. A plurality of walls 166 can additionally be bonded to one another to form and enclose a plurality of reservoirs 134 therebetween. For example, the walls 166a,b,c can enclose a plurality of reservoirs 134 that are basins 164a,b, as shown in FIG. 6. Typically, each of the walls 166 comprises a thickness of from about 0.1 to about 1 cm (from about 0.04 to about 0.40 inches), and more preferably from about 0.1 to about 0.25 cm (from about 0.04 to about 0.10 inches).

Returning to FIG. 5, the walls 166 are bonded to one another at a plurality of bonding regions 168 between the walls 166 such that the bottom of one wall 166 covers the basin 164a,b formed by the wall 166b underlying it. In one embodiment, an upper wall 166a is sealed to a lower wall 166b at a peripheral sidewall 167a about the radial periphery to form the first basin 164a. A second reservoir 134 that is a basin 164b is formed by sealing a third wall 166c at the peripheral sidewall 167b below the lower wall 166b. The bonding regions 168 typically have a thickness of from about 0.0002 to about 0.0127 cm (equivalent to from about 0.0001 to about 0.0050 inches). The walls 166 are aligned to one another so that the basins 164, first and second fluid inlets 174, 184, and first and second fluid outlets 180, 176 form the heat transfer system 132 that is used to regulate the temperature of the substrate support 120.

The first fluid inlet 174 comprises an inlet port near a peripheral portion of the reservoir 134; and the first fluid outlet 176 comprises an outlet port near a central portion of the reservoir 134. The heat transfer fluid 138 is supplied to the first basin 164a through the first inlet 174 to guide the heat transfer fluid 138 to the first basin 164a. The fluid 138 is then circulated through the first basin 164a and ejected through a plurality of first outlets 180. The first outlets 180 may terminate at a radially central portion 182 of the first basin 164a. After the heat transfer fluid 138 exits through the first outlets 180 (of the first basin 164a), it is received into the second basin 164b via second inlets 184. The first outlets 180 become the second inlets 184 that supply the fluid 138 to the second basin 164b. The fluid 138 passes through the second basin 164b and then is evacuated through the second outlet 176.

The closed basins 164 allow a sufficient volume of turbulent heat transfer fluid 138 to flow therethrough to maintain the desired temperature of the support 120. For example, the closed basins 164 may allow the passage of at least about 7.5 liters/min of the heat transfer fluid 138. The enhancement of heat transfer is achieved by flowing the heat transfer fluid 138 through an enclosed volume that is below, and extends substantially continuously across, the substantially the entire area of the substrate 104, and simultaneously generating turbulence in the flow of the heat transfer fluid 138 in the volume.

At least one of the reservoirs 134 comprises a plurality of protrusions 186 extending downwardly from the upper wall 166a into the reservoir 134, causing the heat transfer fluid 138 to flow around the protrusions 186 in the reservoir 134. The protrusions 186 obstruct the flow of the heat transfer fluid 138 to cause turbulence in the heat transfer fluid 138, thereby improving heat conduction between the heat transfer fluid 138 and the support 120.

The protrusions 186 also disrupt the formation of stagnant laminae that would otherwise reduce heat transfer between the heat transfer fluid 138 and the base 124. These stagnant laminae have temperatures that are closer to the actual temperature of the chuck 122 than the desired temperature, and thus reduce the efficiency of temperature regulation of the chuck 122. For example, laminae having reduced flow speeds may form near the inner surface 190 of the reservoir 134, resulting in stagnant boundary layers in the flow of the heat transfer fluid 138 and consequently impeding heat transfer. These stagnant laminae form when the heat transfer fluid 138 near the inner surface 190 is held back by friction against the inner surface 190.

In one version, the protrusions 186 comprise mesas 188, as shown in FIGS. 5 and 6. The mesas 188 may be shaped as discrete protruding segments having polyhedra or rectangular-shaped cross-sections, angled or angular segments that are positioned at acute or obtuse angles to the substrate receiving surface 35. The mesas 188 may also be of different height, width and length within the reservoir 134. Depending upon the arrangement of the mesas 188 in the reservoir 134, the height can range from about 10 to about 20 mm. The width may be from about 10 to about 20 mm. The depth can also vary.

In one embodiment, the mesas 188 are formed by a porous three-dimensional structure. For example, the three-dimensional structure may have a porosity of from about 50% to about 97% open space. A porosity per linear length of from about 5 to about 40 pores per linear inch (ppi) (from about 2 to about 16 pores per linear centimeter) may also be desirable. Aluminum Duocel® (trademark of ERG Corporation, Oakland, Calif.) and silicon carbide Duocel® are two examples of porous materials that may be used to form the mesas 188. Duocel® has a continuously connected, open-celled (reticulated) geometry with a duodecahedronal cell shape.

The mesas 188 are arranged to create consistent turbulence in flow patterns throughout the area below the substrate 104. An example of such an arrangement is a waffle pattern. The heights, lengths, and widths of each mesa 188 within the pattern may vary, but this dimensional variation also follows a pattern conducive to even heat distribution in the reservoir 134. In one embodiment, the mesas 188 are equally sized and periodically spaced apart in the reservoir 134.

Returning to FIG. 1, a gas recirculator 191 may provide a heat transfer gas to the receiving surface 128 of the support 120 to control the temperature of the substrate 104. In this version, the chuck 122 of the support 120 comprises (i) a gas conduit 192 for holding the heat transfer gas in the chuck 122, and (ii) gas vents 194 extending from the gas conduit 192 to the receiving surface 128 for providing the heat transfer gas to the receiving surface 128 of the support 120 below the substrate 104. During operation, the heat transfer gas flows into the gas conduit 192 in the support 120, through the gas vents 194, and exits below the receiving surface 128. The heat transfer gas is used to provide efficient heat transfer rates between the substrate 104 and the chuck 122, the temperature of the chuck 122 in turn being controlled by the fluid recirculator 141. The substrate 104 covers and seals the peripheral edge of the chuck 122 to reduce leakage of the heat transfer gas from below the substrate 104 to maintain the substrate 104 at a constant temperature. Typically, the heat transfer gas is an inert gas, such as helium or argon, supplied at a pressure of from about 5 to about 30 Torr.

In operation, process gas is introduced into the chamber 106 through a process gas supply 130 that includes a process gas source 117 and a gas distributor 137. The gas distributor 137 may comprise one or more conduits 136 having one or more gas flow valves 133 and one or more gas outlets 145 around a periphery of the substrate 104 which may be held in the process zone 108 on a support 120 having a substrate receiving surface 128. Alternatively, the gas distributor 137 may comprise a showerhead gas distributor (not shown). Spent process gas and etchant byproducts are exhausted from the chamber 106 through an exhaust 151, which may include an exhaust conduit 177 that receives spent process gas from the process zone 108, a throttle valve 135 to control the pressure of process gas in the chamber 106, the treatment reactor 150, and one or more exhaust pumps 156.

The process gas may be energized to process the substrate 104 by a gas energizer 154 that couples energy to the process gas in the process zone 108 of the chamber 106. In the version shown in FIG. 1, the gas energizer 154 comprises process electrodes 139, 149 that may be powered by a power supply 159 to energize the process gas. The process electrodes 139, 149 may include an electrode 149 that is, or is in, a wall, such as a sidewall 114 or ceiling 118 of the chamber 106 that may be capacitively coupled to another electrode 139, such as an electrode in the support 120 below the substrate 104. Alternatively or additionally, as shown in FIG. 1, the gas energizer 157 may comprise an antenna 175 comprising one or more inductor coils, which may have a cylindrical symmetry about the center of the chamber 106. In yet another version, the gas energizer 154 comprises a microwave source and waveguide to activate the process gas by microwave energy in a remote zone (not shown) upstream from the chamber 106.

To process a substrate 104, the process chamber 106 is evacuated and maintained at a predetermined sub-atmospheric pressure. The substrate 104 is then provided on the support 120 by a substrate transport 101, such as for example a robot arm and a lift pin system. The gas supply 130 provides a process gas to the chamber 106 and the gas energizer 154 couples RF energy to the process gas to energize the gas to process the substrate 104. For example, very high frequency (VHF) electromagnetic waves having frequencies of from about 30 to about 300 MHz may be coupled into the process gas. A process chamber 106 using VHF energy may especially benefit from the heat transfer system 132 because smaller tolerances of processing temperature and temperature uniformity are desirable for the VHF gas energizing. Alternatively, microwaves may be coupled into the process gas. Similarly, to clean the chamber after processing of the substrate 104, the gas supply 130 provides a process gas comprising a cleaning gas to the chamber 106 and the gas energizer 154 energizes the cleaning gas to clean the chamber 106. Effluent generated during the chamber 106 process is exhausted from the chamber 106 and received by the treatment reactor 150, where the effluent may be abated to reduce the hazardous gas content of the effluent.

A controller 300 may be used to operate the substrate processing apparatus 102 and process chamber 106. A suitable controller comprises a computer 302 having a central processing unit (CPU) 306, such as a Pentium Processor commercially available from Intel Corporation, Santa Clara, Calif., that is coupled to a memory 308 and peripheral computer components. The controller 300 may further comprise a plurality of interface cards (also not shown) including, for example, analog and digital input and output boards, interface boards, and motor controller boards. The interface between an operator and the controller 300 can be, for example, via a display 316 and a light pen 318.

The CPU 306 further comprises a memory 308, a removable storage medium 310, a non-removable storage medium 312, random access memory (RAM) 314, a display 316 and a light pen 318. The CPU 306 is linked with a hardware interface 304, which is set to operate the chamber components via a factory automation host computer 338 with a host software program 340.

The controller 300 further comprises a computer readable program 320 to operate components 321 of the chamber 106, such as process selector, chamber selection, process gas flow rate, temperature, gas pressure and bias power level. For example, the computer readable program 320 comprises a process sequencer instruction set 322, a chamber manager instruction set 324, a substrate positioning instruction set 326, a gas flow control instruction set 328, a heat transfer fluid flow instruction set 337, a temperature control instruction set 332, a gas energizer control instruction set 334, a process monitoring instruction set 336, an exhaust control instruction set 330, a pressure control instruction set 337 and a treatment control instruction set 339.

The computer readable program 320 comprises program code, which can be written in any conventional computer-readable programming language, such as for example, assembly language or C++. Suitable program code is entered into a single file, or multiple files, using a conventional text editor, and stored or embodied in the computer memory 308. If the entered code text is in a high level language, the code is compiled, and the resultant compiler code is then linked with an object code of precompiled library routines. To execute the linked compiled object code, the operator invokes the program code, causing the controller 300 to load the object code into the computer memory 308. The CPU 306 reads and executes the program code to perform the tasks identified therein.

While the present invention has been described in considerable detail with reference to certain preferred versions, many other versions should be apparent to those of ordinary skill in the art. For example, the substrate support described herein can be used in a plasma vapor deposition (PVD) chamber or other deposition chambers. Therefore, the spirit and scope of the appended claims should not be limited to the description of the preferred versions contained herein.

What is claimed is:

1. A substrate support comprising:
  (a) a chuck having a substrate receiving surface; and (b) a base comprising:
  (1) an upper wall comprising a recessed trench having (i) an attachment face at a first depth, and (ii) a fluid channel at a second depth, the fluid channel comprising an aspect ratio of depth to width of from about 2:1 to about 4:1;
  (2) a lower wall seated in the recessed trench and attached to the attachment face of the upper wall, to close the fluid channel, the lower wall comprising a plurality of protrusions that extend into the fluid channel;
  (3) a fluid inlet to supply a heat transfer fluid to the fluid channel; and
  (4) a fluid outlet to discharge the heat transfer fluid from the fluid channel.

2. A support according to claim 1 wherein upper wall is electron beam brazed or welded to the lower wall at the attachment face.

3. A support according to claim 1 wherein the fluid channel has a width that is smaller than the width of the recessed trench at the first depth.

4. A support according to claim 1 wherein the fluid channel comprises serpentine convolutions such that the fluid channel curves back and forth along its length.

5. A support according to claim 4 wherein the fluid channel curves back and forth along its length at least 1 back and forth turn per 5 centimeters.

6. A support according to claim 1 wherein the upper wall comprises a plurality of integral fins that extend outwardly into the fluid channel.

7. A support according to claim 6 wherein the plurality of integral fins have an aspect ratio of height to thickness of at least about 10:1.

8. A support according to claim 6 wherein the integral fins extend downwardly from the upper wall.

9. A support according to claim 1 wherein the chuck comprises an electrostatic chuck comprising an electrode covered by a dielectric, and an electrical contact to charge the electrode.

10. A support according to claim 1 wherein the fluid inlet and fluid outlet are near each other.

11. A substrate processing chamber comprising a substrate support according to claim 1, the chamber further comprising:
  a gas supply conduit to provide a gas into the chamber;
  a gas energizer to energize the gas to form a plasma; and
  an exhaust port to exhaust the gas from the chamber.

12. A substrate support comprising:
  (a) an electrostatic chuck having a substrate receiving surface; and
  (b) a base comprising:
    (1) an upper wall comprising a recessed trench having (i) an attachment face at a first depth, and (ii) a fluid channel at a second depth, the upper wall comprising at least one fin that extends outwardly into the fluid channel, the fin comprising an aspect ratio of height to thickness of at least about 10:1;
    (2) a lower wall seated in the recessed trench and attached to the attachment face of the upper wall, to close the fluid channel;
    (3) a fluid inlet to supply a heat transfer fluid to the fluid channel; and
    (4) a fluid outlet to discharge the heat transfer fluid from the fluid channel.

13. A support according to claim 12 wherein the fluid channel has a width that is smaller than the width of the recessed trench at the first depth.

14. A support according to claim 12 wherein the fluid channel comprises serpentine convolutions such that the fluid channel curves back and forth along its length at least 1 back and forth turn per 5 centimeters.

15. A support according to claim 12 wherein the fluid channel comprises an aspect ratio of depth to width of from about 2:1 to about 4:1.

16. A support according to claim 12 wherein the fin extends downwardly from the upper wall.

17. A substrate processing chamber comprising a substrate support according to claim 12, the chamber further comprising:
  a gas supply conduit to provide a gas into the chamber;
  a gas energizer to energize the gas to form a plasma; and
  an exhaust port to exhaust the gas from the chamber.

18. A substrate support comprising:
  (a) an electrostatic chuck having a substrate receiving surface; and
  (b) a base comprising:
    (1) an upper wall comprising a recessed trench having (i) an attachment face at a first depth, and (ii) a fluid channel at a second depth, the fluid channel comprising serpentine convolutions such that the fluid channel curves back and forth along its length at least 1 back and forth turn per 5 centimeters;
    (2) a lower wall seated in the recessed trench and attached to the attachment face of the upper wall, to close the fluid channel;
    (3) a fluid inlet and a fluid outlet that are near each other.

19. A substrate processing chamber comprising a substrate support according to claim 18, the chamber further comprising:
  a gas supply conduit to provide a gas into the chamber;
  a gas energizer to energize the gas to form a plasma; and
  an exhaust port to exhaust the gas from the chamber.

20. A support according to claim 12 wherein the lower wall comprises a plurality of protrusions that extend into the fluid channel.

21. A support according to claim 18 wherein the lower wall comprises a plurality of protrusions that extend into the fluid channel.

22. A substrate support comprising:
  (a) an electrostatic chuck having a substrate receiving surface; and
  (b) a base comprising:
    (1) an upper wall comprising an attachment face and a fluid channel, the upper wall comprising at least one fin having an aspect ratio of height to thickness of at least about 10:1; and
    (2) a lower wall attached to the attachment face of the upper wall to close the fluid channel, the lower wall comprising a plurality of projections that extend outwardly into the fluid channel.

23. A substrate support comprising:
  (a) an electrostatic chuck having a substrate receiving surface; and
  (b) a base comprising:
    (1) an upper wall comprising an attachment face and a fluid channel, the fluid channel comprising serpentine convolutions such that the fluid channel curves back and forth along its length at least 1 back and forth turn per 5 centimeters; and
    (2) a lower wall attached to the attachment face of the upper wall to close the fluid channel.

24. A support according to claim 18 wherein the fluid channel comprises an aspect ratio of depth to width of from about 2:1 to about 4:1.

25. A support according to claim 18 wherein the fluid channel has a width that is smaller than the width of the recessed trench at the first depth.

26. A support according to claim 18 wherein the upper wall comprises a plurality of integral fins that extend outwardly into the fluid channel.

27. A support according to claim 22 wherein the fluid channel comprises serpentine convolutions such that the fluid channel curves back and forth along its length.

28. A support according to claim 22 wherein the fluid channel comprises an aspect ratio of depth to width of from about 2:1 to about 4:1.

29. A substrate processing chamber comprising a substrate support according to claim 22, the chamber further comprising:
   a gas supply conduit to provide a gas into the chamber;
   a gas energizer to energize the gas to form a plasma; and
   an exhaust port to exhaust the gas from the chamber.

30. A support according to claim 23 wherein the fluid channel comprises an aspect ratio of depth to width of from about 2:1 to about 4:1.

31. A support according to claim 23 wherein the upper wall comprises a plurality of integral fins that extend outwardly into the fluid channel.

32. A substrate processing chamber comprising a substrate support according to claim 23, the chamber further comprising:
   a gas supply conduit to provide a gas into the chamber;
   a gas energizer to energize the gas to form a plasma; and
   an exhaust port to exhaust the gas from the chamber.

* * * * *